US009793353B1

(12) United States Patent
Tsai

(10) Patent No.: US 9,793,353 B1
(45) Date of Patent: Oct. 17, 2017

(54) MULTIPLE LAYER QUANTUM WELL FET WITH A SIDE-GATE

(71) Applicant: Northrop Grumman Systems Corporation, Falls Church, VA (US)

(72) Inventor: Roger S. Tsai, Torrance, CA (US)

(73) Assignee: Northrop Gumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/464,528

(22) Filed: Mar. 21, 2017

(51) Int. Cl.
| | |
|---|---|
| H01L 29/786 | (2006.01) |
| H01L 29/15 | (2006.01) |
| H01L 29/417 | (2006.01) |
| H01L 29/06 | (2006.01) |
| H01L 29/778 | (2006.01) |
| H03F 3/193 | (2006.01) |
| H01L 29/78 | (2006.01) |
| H01L 27/088 | (2006.01) |
| H01L 29/205 | (2006.01) |
| H03F 1/32 | (2006.01) |
| H01L 21/8234 | (2006.01) |

(52) U.S. Cl.
CPC .... *H01L 29/152* (2013.01); *H01L 21/823412* (2013.01); *H01L 27/0886* (2013.01); *H01L 29/0692* (2013.01); *H01L 29/205* (2013.01); *H01L 29/41758* (2013.01); *H01L 29/7783* (2013.01); *H01L 29/785* (2013.01); *H01L 29/78696* (2013.01); *H03F 1/3205* (2013.01); *H03F 3/193* (2013.01); *H03F 2200/451* (2013.01); *H03F 2201/3215* (2013.01)

(58) Field of Classification Search
CPC ....... H01L 21/70; H01L 21/702; H01L 21/71; H01L 21/8232
See application file for complete search history.

(56) References Cited

U.S. PATENT DOCUMENTS

| 5,619,061 A | 4/1997 | Goldsmith et al. |
|---|---|---|
| 9,202,906 B2 | 12/2015 | Howell et al. |
| 2013/0175530 A1* | 7/2013 | Noda ................ H01L 29/78693 257/57 |

OTHER PUBLICATIONS

Pan, K.C. et al; Vanadium Oxide Thin-Film Variable Resistor-Based RF Switches; IEEE Transactions on Electron Devices, vol. 62, No. 9; Sep. 2015; pp. 2959-2965; 0018-9383; IEEE; 2015.
Nang, M. et al; Need a Change? Try GeTe; IEEE Microwave Magazine; Dec. 2016; 1524-3342/16; pp. 70-79; Digital Object Identifier 10.1109/MMM.2016.2608699.

(Continued)

*Primary Examiner* — Cheung Lee
(74) *Attorney, Agent, or Firm* — Patti & Malvone Law Group, LLC

(57) ABSTRACT

An exemplary FET includes a substrate and multiple vertically stacked layer groups with each layer group having a quantum well semiconductive layer and a nonconductive layer adjacent the first quantum well semiconductive layer. Conductive source and drain electrodes in conductive contact with the semiconductive layers. A 3-dimensional ridge of the stacked layer groups is defined between spaced apart first and second trenches which are between the source and drain electrodes. A continuous conductive side gate is disposed on the sides and top of the ridge for inducing a field into the semiconductive layers. A gate electrode is disposed in conductive contact with the conductive side gate.

19 Claims, 7 Drawing Sheets

(56) References Cited

OTHER PUBLICATIONS

Nakamoto, M. et al; Uniform, Stable and High Integrated Field Emitter Arrays for High Performance Displays and Vacuum Microelectronic Switching Devices; 0-7803-4100-7/97; 1997 IEEE; IEDM 97-717-720; 29.3.1-29.3.4.

Jacobs, E.W. et al; Photo-Injection PIN Diode Switch for High Power RF Switching; 0-7803-6520-8/01; 2001; IEEE; pp. 1274-1279.

Cai, M. et al; Micro-Plasma Field-Effect Transistors; 978-1-4577-1767/3/12; 2012; IEEE; 4 Pages.

Cross, L.E. et al; Theory and Demonstration of Narrowband Bent Hairpin Filters Integrated with AC-Coupled Plasma Limiter Elements; IEEE Transactions on Electromagnetic Compatibility, vol. 55, No. 6, Dec. 2013; 0018-9375; 2013; pp. 1100-1106.

* cited by examiner

Fig. 1
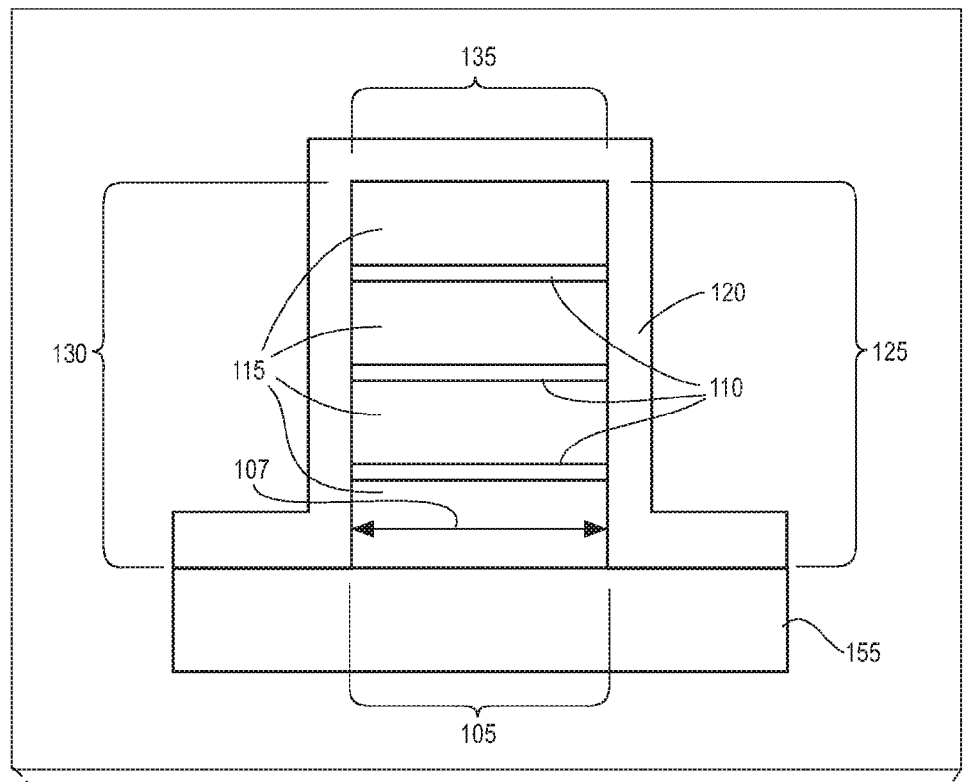
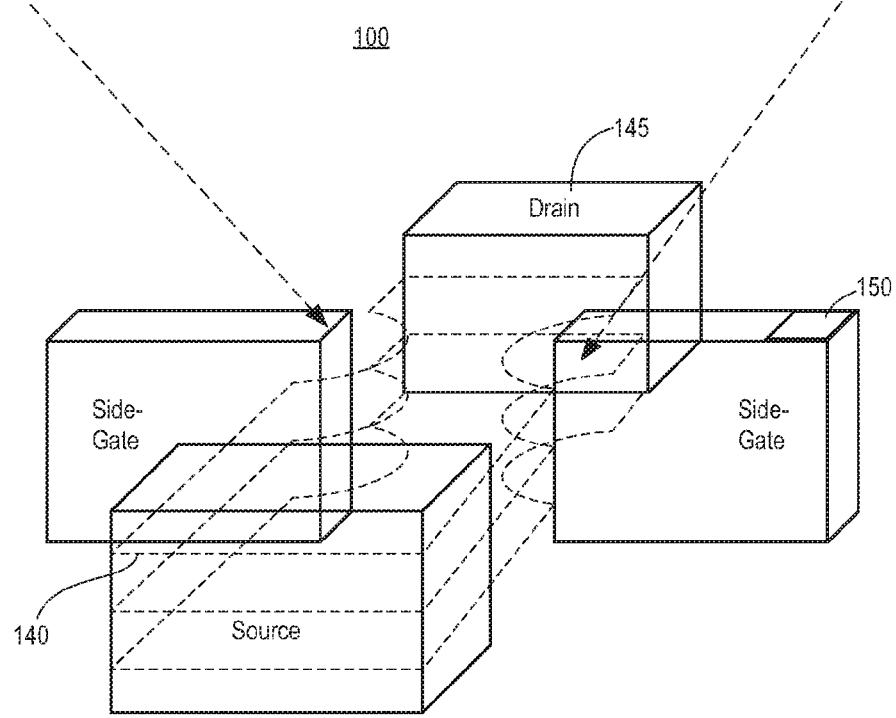

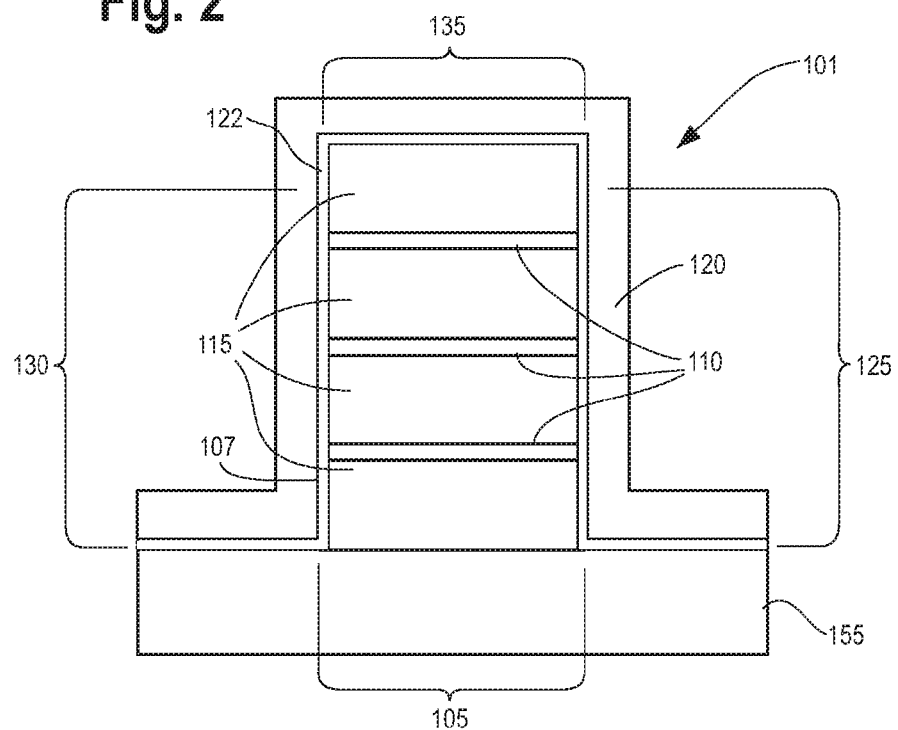
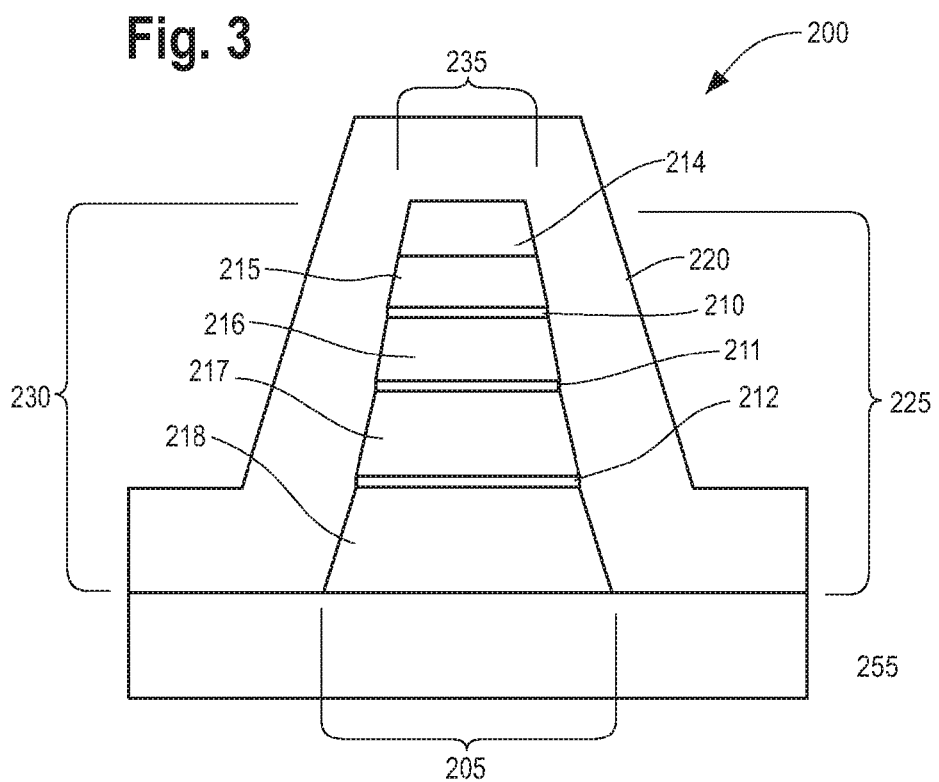

Fig. 6

| III-V Semiconductor Material for Quantum Well Channel | Eg Bandgap (eV) | Relative Dielectric Constant (unitless) | Electron Vsat (cm/s) | Calculated GM per quantum well per ridge (uS) | Ecrit (MV/cm) | BV Breakdown Voltage (V) | Calc. Power Handling (dBm) | Calc. Intrinsic fT (GHz) |
|---|---|---|---|---|---|---|---|---|
| InAs | 0.35 | 14 | 3E7 | 150 | 0.04 | 2.5 | 10-12 | 240 |
| InP* | 0.7 | 13.5 | 2.0E7 | 95 | 0.2 | 4 | 15 | 160 |
| GaAs** | 1.1 | 13 | 1.5E7 | 69 | 0.3 | 12 | 25 | 120 |
| GaN | 3.4 | 9.5 | 0.6E7 | 20 | 3.3 | 50 | 40 | 50 |

Electron carriers
*InGaAs layer channel, X(In) 53%
**InGaAs, X(In) 22%

MULTIPLE LAYER QUANTUM WELL FET WITH A SIDE-GATE

BACKGROUND

This invention relates to field effect transistors (FETs) that use quantum wells and more specifically to FETs having high linearity when used as a radio frequency (RF) amplifier, especially at microwave and millimeter-wave frequencies.

Electronic applications operating at microwave and millimeter-wave frequencies and requiring linearity in RF amplification place increasing demands on transistors to provide such amplification. It is a challenge to make transistors with characteristics that will provide RF amplification at ultra high frequencies, e.g. up to 300 GHz, with high linearity. Although high electron mobility transistors (HEMTs) have been utilized, there exists a need for transistors that can provide improved RF linearity performance with reduced DC power consumption while operating at ultra high frequencies.

SUMMARY

It is an object of the present invention to provide an improved FET that satisfies this need.

An exemplary FET includes a substrate and multiple vertically stacked layer groups with each layer group having a quantum well semiconductive layer and a nonconductive layer adjacent the first quantum well semiconductive layer. Conductive source and drain electrodes in conductive contact with the semiconductive layers. A 3-dimensional ridge of the stacked layer groups is defined between spaced apart first and second trenches which are between the source and drain electrodes. A continuous conductive side gate is disposed on the sides and top of the ridge for inducing a field into the semiconductive layers. A gate electrode is disposed in conductive contact with the conductive side gate. The dimensional relationships, as will be described in more detail, enables the FET to provide improved linearity in the amplification of small RF signals, improved cutoff frequency response, and reduced DC power consumption.

DESCRIPTION OF THE DRAWINGS

Features of exemplary implementations of the invention will become apparent from the description, the claims, and the accompanying drawings in which:

FIG. 1 is a representative diagram of an FET in accordance with an embodiment of the present invention. It includes an exploded cross-sectional representation of a "ridge" with multiple semiconducting channel layers, separated by non-conducting barrier layers, and a conductive side-gate.

FIG. 2 shows the same exploded embodiment as FIG. 1 but with an insulating layer between the side-gate and the ridge.

FIG. 3 is a representative cross-sectional view of one ridge of an exemplary FET in accordance with an embodiment of the present invention.

FIG. 6 is a table illustrating representative characteristic parameters for FET embodiments using different semiconductor materials.

DETAILED DESCRIPTION

Figure 4:
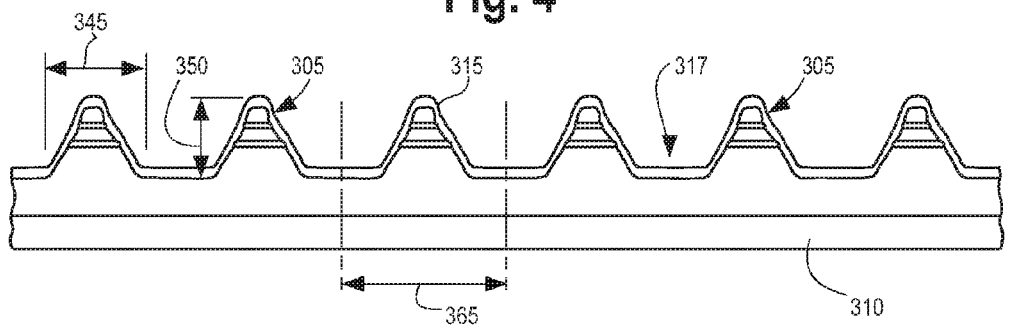
FIG. 4 shows a representative cross-sectional view of an exemplary FET in accordance with an embodiment of the present invention having a plurality of parallel ridges.

FIG. 1 shows a representative FET transistor 100 in accordance with an embodiment of the present invention. The transistor 100 employs a heterodimensional field effect in a 3-dimensional side-gate with multiple stacked 2-dimensional charge carrier populations in semiconductor quantum well channels. The RF characteristics of the exemplary transistor can be scaled as a function of channel width, length, number of channels, and number of stacked quantum wells. The transistor provides high RF linearity, i.e. low harmonic distortion. Contributing to the high RF linearity is a linear drain current to gate control voltage relationship provided by the heterodimensional field effect. This translates into a flat transconductance characteristic that produces low RF distortion transistor amplifiers.

An idealized cross-sectional representation of a ridge 105 shows multiple, vertically stacked, planar layers of semiconducting quantum well layers 110 each separated by corresponding nonconductive (semiconductor barrier) layers 115. A conductive side-gate 120, e.g. made of a metal, engages the sides 125 and 130 and top 135 of the 3-dimensional ridge 105. The width of layers 115 defines the spacing between quantum well channel layers 110. The channel width 107 extends as shown. In a preferred embodiment the ratio of the channel width to the spacing between quantum well layers (channel width/spacing) is less than or equal to 8. In more preferred embodiments, the ratio is less than 4 and greater than 0.3. The quantum well channel layers and nonconductive barrier layers are composed of compound semiconductor materials or alloys of compound semiconductors such that the energy bandgaps of the quantum well channel layers are lower than the bandgaps of the adjoining barrier layers, with the energy band alignment between each quantum well and barrier interface being type 1 or 2. In a preferred embodiment the quantum well channel layer is composed of InGaAs with barrier layers composed of InAlAs, with a type 1 "straddling gap" energy band alignment at each InAlAs and InGaAs interface. The quantum well channels may be modulation-doped by a doping plane or layer within each adjoining barrier layer, or may be piezoelectrically doped in the case of GaN/AlN/InN compound semiconductors in a Wurtzite crystal structure. A preferred embodiment utilizes delta doping planes in InAlAs in order to modulation dope InGaAs quantum well channel layers.

Each of the semiconductive layers 110 are in low resistance contact, i.e. low resistance contact, at the respective ends of the planar layers to a source electrode or contact 140 and a spaced apart drain electrode or contact 145 of the FET 100. A gate electrode or contact 150 can be disposed at any convenient location in a low resistance connection with the side-gate 120. The layers 110 and 115 are disposed on a nonconductive substrate or base 155. The semiconductive layers 110, i.e. channel layers, are separated by the nonconductive layers 115 to form continuous and parallel quantum well channels connecting the source and drain electrodes.

FIG. 2 shows an exploded embodiment 101 similar to the corresponding structure shown in FIG. 1 but with an insulating (non-conductive) layer 122 disposed between the side-gate 120 and the ridge 105. Depending on the design objectives and desired characteristics, using an insulated side-gate may be desirable.

FIG. 3 shows a cross-sectional view of one ridge 205 of exemplary FET 200 in a practical implementation in which semiconductor manufacturing methods, e.g. epitaxial fabrication, deposition, etching, etc., have been used to fabricate the ridge. In this embodiment will be noticed that the sides 225, 230 of the ridge 205 are generally vertical relative to the planar substrate/base 255 but are sloped to form a pyramid shape with the layers of the ridge becoming narrower as the distance to the substrate 255 increases.

In the exemplary FET 200 three semiconducting quantum well channels 210, 211 and 212 have corresponding channel widths (cw) 1, 2 and 3. Channels 210, 211 and 212 have corresponding insulating layers 215, 216 and 217 having corresponding thicknesses of A1, A2 and A3, respectively. A top insulating layer 214 is disposed between insulating layer 215 and the top portion of the side gate 220. A bottom nonconductive semiconductor buffer layer 218 is disposed between semiconductor layer 212 and the substrate 255. For the exemplary pyramid shaped ridge where the charge density in each of the semiconducting channels is substantially the same, the following relationships are preferred in order to keep turn-ON side gate voltage for each channel layer substantially equal:

$$cw1/A1 <= cw2/A2 <= cw3/A3 <= 8$$

and for the general case where N number of semiconducting channels are used:

$$cw1/A1 <= cw2/A2 <= cw(N-1)/A(N-1) <= cw(N)/A(N) <= 8.$$

The turn-ON side gate voltage for each quantum well semiconductive layer being substantially the same/equal meaning each side gate turn-ON voltage being within 20% of the same voltage. The charge density in each of the quantum well semiconductive layers being substantially the same means the charge density in each being within 20% of a given charge density.

This slope may be achieved by an etching away fabrication process since the upper layers will have been exposed for etching for a longer time than the lower layers near the substrate 255, assuming the etching starts from the top. It is anticipated that the side-gate 220 will be deposited following the etching process to extend across the ridge and adjacent trenches/valleys. Multiple ridges can be thus form on substrate 255.

The ridge 205 may be formed by etching away spaced apart portions of the parallel layers resulting in one or more generally parallel ridges or "saddles" remain between the etched away areas (trenches); see FIG. 1. Although FIG. 1 shows only left and right portions of the side gate 120/220, it will be understood that this is only to facilitate a better view of the ridge structure and that the actual structure of the side gate 120/220 extends continuously over and engaging the entirety of the ridge including its top as shown in FIGS. 2 and 3.

The operation of the FETs 100, 101 and 200 is based on capacitive and lateral coupling to carriers in each channel layer by fields from the side gate. The gate to source voltage applied to the side gate modulates carrier concentration at lateral edges in each channel layer as a function of the magnitude of the gate to source voltage. Since the change in carrier concentration for each channel is substantially the same for a given applied gate voltage, this produces a corresponding linear response of drain to source current for the FET. Each channel may be doped with carriers by any conventional means, e.g. modulation, piezoelectric, electrostatic, etc., and may be doped to different effective concentrations, but all channels should be doped with the same carrier type, i.e. electron or hole.

FIG. 4 shows a representative cross-sectional view of an exemplary FET transistor 300 which has a plurality of parallel ridges 305 on a substrate 310. Each ridge 305 has a plurality of layers as explained above. A single continuous conductive side gate 315 abuts and traverses across the sides and top of the ridges and adjacent trenches/valleys 317. The ridge has a width 345 and a height 350. The ridge pitch, i.e. dimension of the repetitive spacing of the ridges, is represented by 365.

Figure 5:
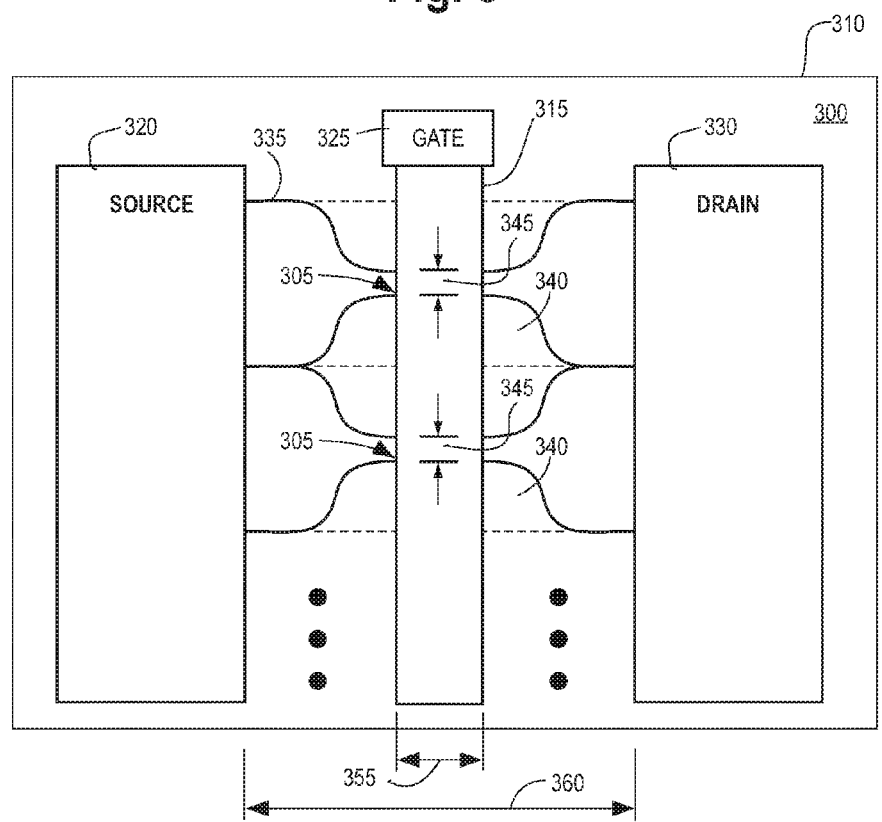
FIG. 5 is an illustrative top view of an exemplary FET having multiple parallel ridges in accordance with an embodiment of the present invention.

FIG. 5 shows an illustrative top view of an exemplary FET transistor 300 having multiple parallel ridges 305. Source contact 320, gate contact 325 and drain contact 330 provide conductive pads for connecting the transistor 300 to other circuitry. A nonconductive top layer 335, and corresponding interleaved semiconductive and nonconductive layers below, extended with uniform width from the source 320 to the drain 330 prior to the etching of the ridges 305. The regions 340 adjacent the conductive side gate 315 as shown in FIG. 5 represent areas (trenches) in which the interleaved layers have been etched away. The width 345 of the ridge and the ridge height 350 define an aspect ratio of the ridges. The width of the side gate is represented by 355 and the source to drain spacing is represented by 360.

FIG. 6 is a table 600 illustrating representative characteristic parameters for exemplary FET embodiments in accordance with the present invention using different semiconductor materials. Each of columns 602-609 correspond to a different parameter or characteristic identified in row 620 for the respective columns. Rows 621, 622, 623 and 624 in column 601 identify an exemplary FET in accordance with the present invention made with the indicated semiconducting materials. Each of rows 621, 622, 623 and 624 show characteristics/parameters associated with the exemplary FET identified in column 601 of the same row. The listed characteristics/parameters are: 602—bandgap energy; 603—relative dielectric constant; 604—electron saturation velocity; 605—calculated transconductance per quantum well per ridge; 606—Ecrit, defined as the critical electric field for avalanche breakdown; 607—breakdown voltage; 608—calculated power handling; 609—calculated intrinsic high—frequency performance. The four listed semiconductor materials are: 621—Indium Arsenide; 622—Indium Phosphide; 623—Gallium Arsenide; 624—Gallium Nitride. Electron saturated velocity (VSAT) in the semiconductor has an inverse relationship to the bandgap. Generally, higher VSAT enables higher transconductance (GM) per quantum well layer, per ridge. Also, higher channel bandgap enables higher breakdown voltage; increases RF input power handling and survivability; high Imax increases RF linearity. Higher VSAT enables high frequency performance. For these characteristics, the length of the side-gate, LG, (dimension of side-gate from drain to source) is assumed to be $0.2 \times 10^{-6}$ meters. FT, defined as the unity current gain cutoff frequency, has an inverse relationship to carrier transit time across the side-gate dimension LG, and therefore FT has a 1/LG relationship.

Figure 7:
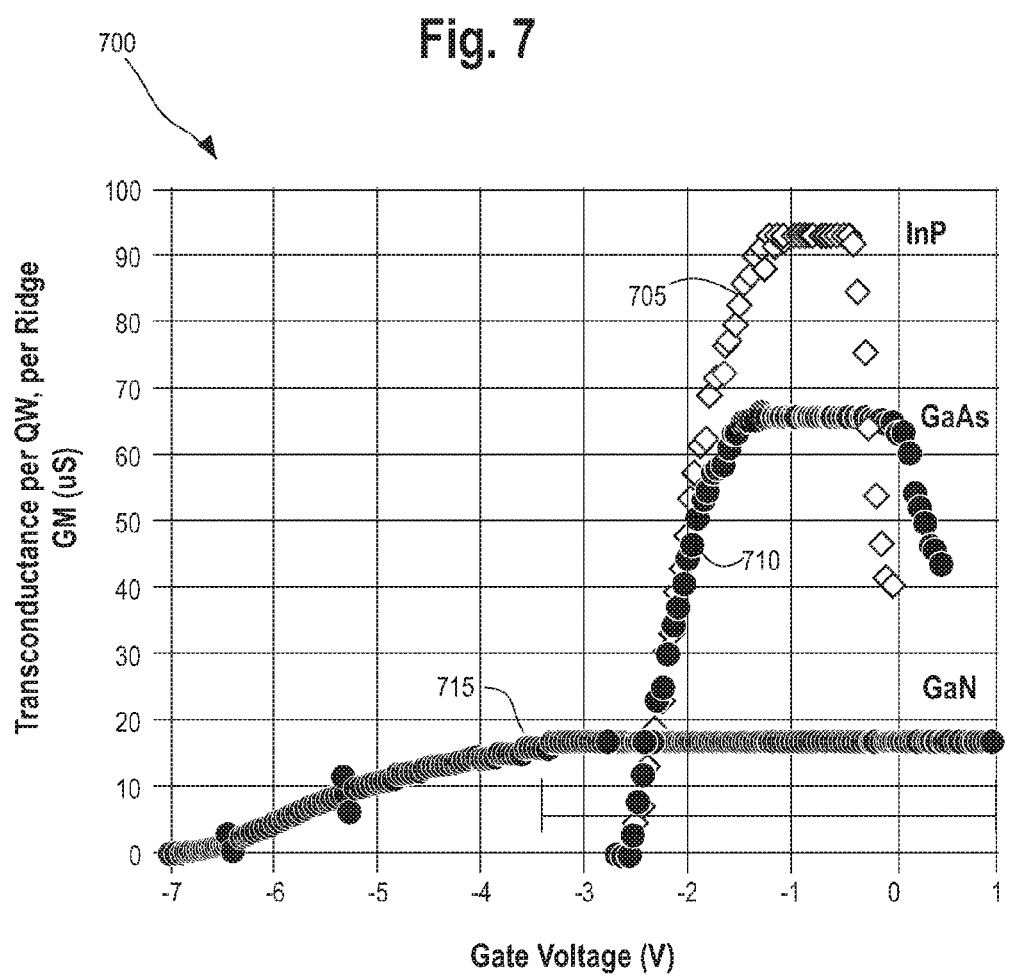
FIG. 7 is a graph showing transconductance versus gate voltage for FET embodiments using different semiconductor materials.

FIG. 7 shows a graph 700 of transconductance per quantum well, per ridge versus gate voltage curves 705, 710 and 715 for three FET embodiments using InP, GaAs and GaN semiconductor materials, respectively. Transconductance ($G_M$) is determined by:

$$G_M \approx 4 \in_S V_S$$

Where $\in_S$ is the relative dielectric constant of non-conductive barrier layers around the quantum well channel layers, and Vs is the electron or hole carrier saturation velocity (VSAT). Looking at FIG. 7 it will be seen that parts of each curve show a flat portion (horizontal portion) indicating a corresponding flat Gm region.

Figure 8:
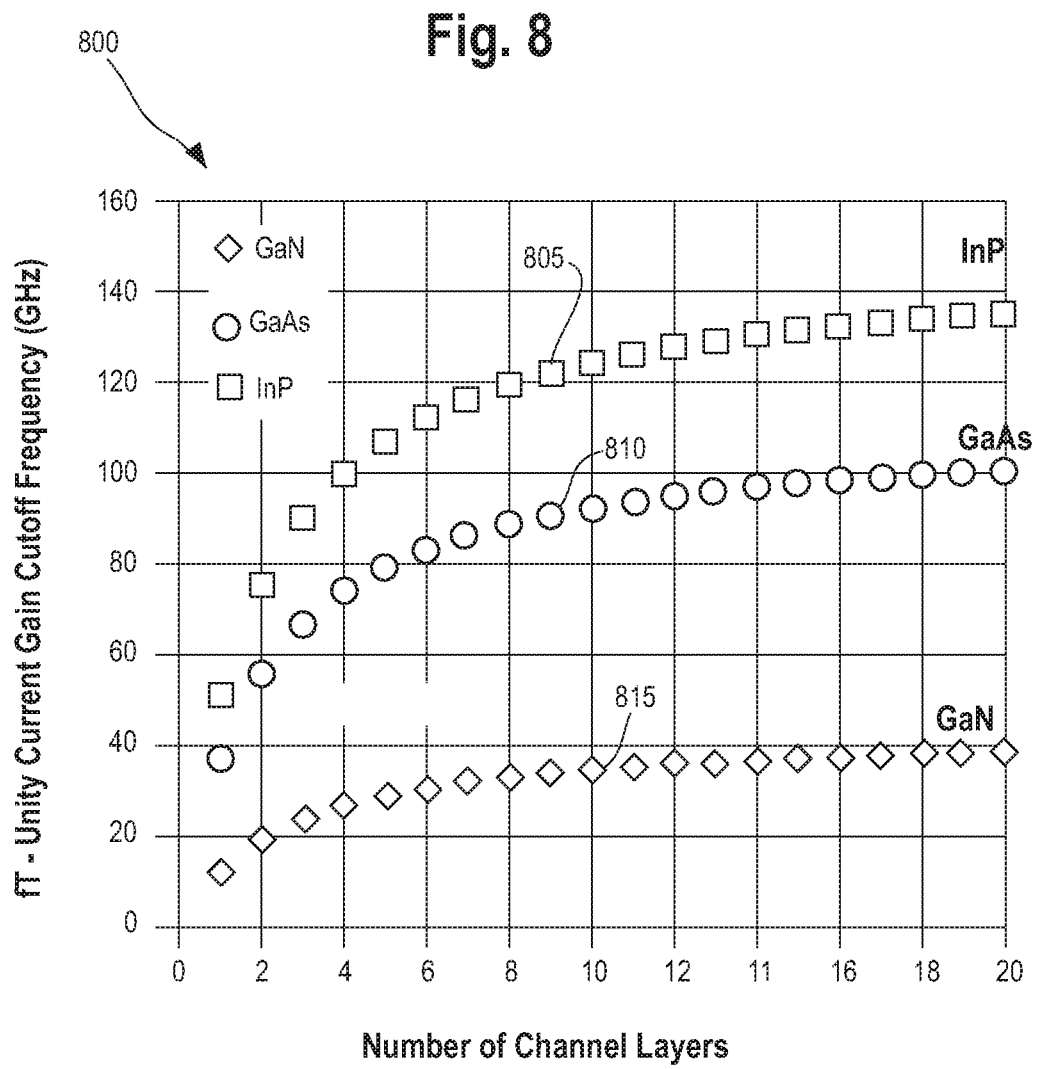
FIG. 8 is a graph showing frequency response versus number of channel layers for FET embodiments using different semiconductor materials.

FIG. 8 shows a graph 800 of curves 805, 810 and 815 of frequency response (cutoff frequency in GHz) versus number of channel layers for three FET embodiments using InP, GaAs and GaN semiconductor materials, respectively. All three curves show various degrees of improvement in frequency response as compared to a transistor utilizing only a single channel layer as could be comparable to currently available transistors. For example, considering a comparison of cutoff frequency for an FET using 10 channel layers versus 1 channel using the same semiconductor material: curve 805 shows an improvement of 125 GHz from 65 GHz; curve 810 shows an improvement of 90 GHz from 38 GHz; curve 815 chosen improvement of 35 GHz versus 10 GHz. Even a much lower number of channel layers, e.g. 3, shows a significant improvement in comparison to a single semiconducting channel.

Figure 9:
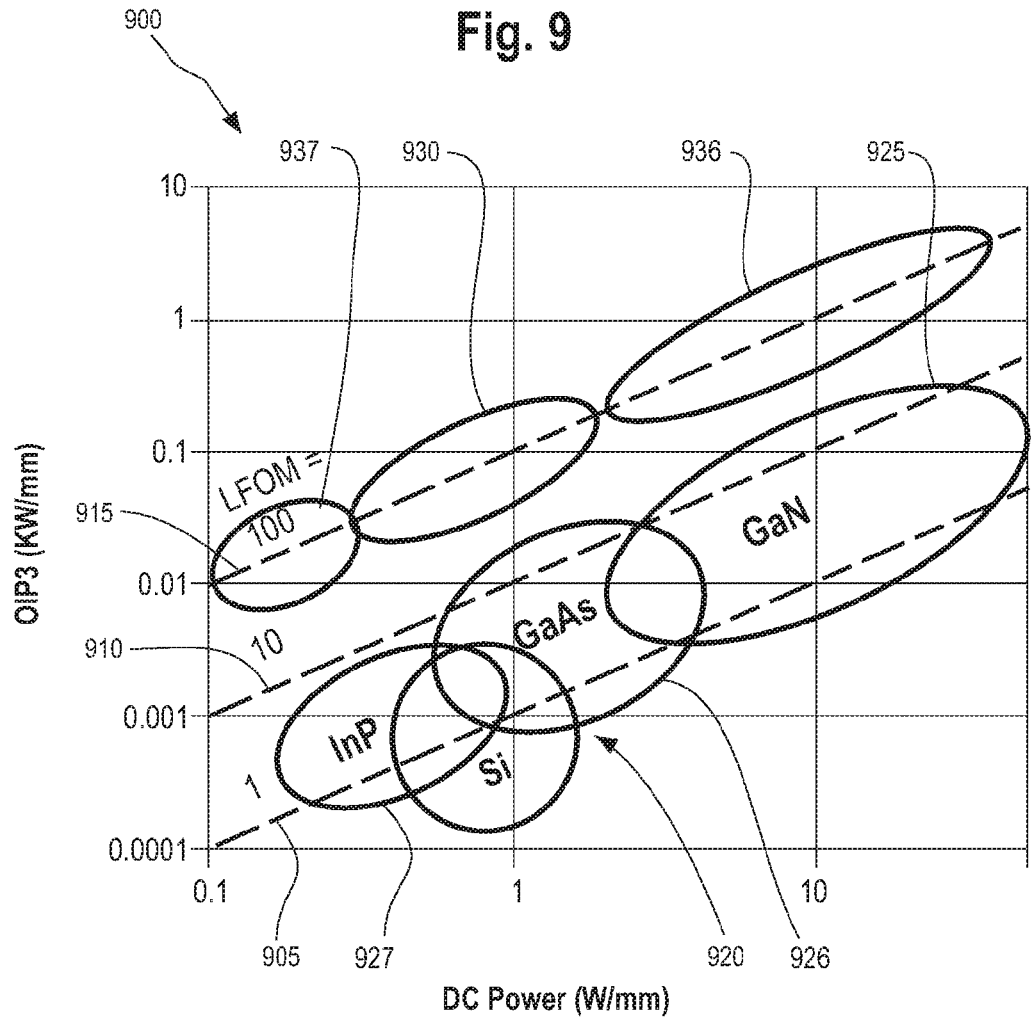
FIG. 9 is a graph showing linearity versus DC power for FET embodiments and other existing transistors.

FIG. 9 shows a graph 900 showing linearity as determined by output third order inter-modulation intercept power versus DC power for FET embodiments in accordance with the present invention and other existing transistors. The dashed straight lines 905, 910 and 915 represent linearity figures of merit of 1, 10 and 100, respectively. Regions 920 represent conventional single conductive channel FET transistors made of the respective materials. Region 925 represents current HEMT Gallium Nitride transistor technology using a single conductive channel with regard to DC power usage and linearity. Region 936 represents an embodiment of an FET in accordance with the present invention using Gallium Nitride showing a capability of a linearity figure of merit of 100 or better and a DC power usage about 10 W/mm. This represents an improvement of approximately 10 times in increased linearity for the same DC power as compared with the HEMT Gallium Nitride transistor, e.g. region 925. Region 930 represents an embodiment of a FET in accordance with the present invention using Gallium Arsenide showing a capability of a linearity figure of merit of 100 or better and a DC power usage somewhat above 1 W/mm. This represents an improvement of approximately 10 times in linearity for the same DC power as compared with the HEMT Gallium Arsenide transistor, e.g. region 926. Region 937 represents an embodiment of a FET in accordance with the present invention using Indium Phosphide showing a capability of a linearity figure of merit of 100 or better and a DC power usage less than 1 W/mm. This represents an improvement of approximately 10 times in linearity for the same DC power compared with the HEMT Indium Phosphide transistor, e.g. region 927.

One exemplary method of making an FET in accordance with the present invention is to grow sequential adjacent layers on a substrate in a known epitaxial technique. The trench/valley regions can then be etched away and the side gate then deposited over the exposed ridge structure. Metallic contact pads for the source, drain and side gate can be deposited to enable connections to be made with the FET. Of course, other techniques could be used as long as the objective final structure results.

Although exemplary implementations of the invention have been depicted and described in detail herein, it will be apparent to those skilled in the art that various modifications, additions, substitutions, and the like can be made without departing from the spirit of the invention.

The scope of the invention is defined in the following claims.

The invention claimed is:

1. A field effect transistor (FET) device comprising:
   a substrate;
   an initial nonconductive layer adjacent the substrate;
   a first layer group having a first quantum well semiconductive layer disposed on the initial nonconductive layer and a first nonconductive layer disposed over the first quantum well semiconductive layer;
   at least a second layer group having a second quantum well semiconductive layer disposed on the first nonconductive layer and a second nonconductive layer disposed over the second quantum well semiconductive layer, the second layer group being vertically stacked on top of the first layer group;
   a top nonconductive layer disposed on a topmost layer group;
   a source electrode in conductive contact with the first and second quantum well semiconductive layers;
   a drain electrode spaced apart from the source electrode and in conductive contact with the first and second quantum well semiconductive layers;
   a first trench disposed between the source and drain electrodes that creates access to first edges of at least all quantum well semiconductive layers;
   a second trench disposed between the source and drain electrodes generally parallel to and spaced apart from the first trench, the second trench creating access to second edges of at least all quantum well semiconductive layers that oppose the first edges;
   a 3-dimensional ridge defined by a portion of the first and second layer groups and the top nonconductive layer, the portion being between the first and second trenches;
   a continuous conductive side gate disposed on the first edges, the top nonconductive layer and the second edges, the continuous conductive side gate being generally perpendicular to the first and second trenches;
   a gate electrode disposed in conductive contact with the continuous conductive side gate.

2. The FET device of claim 1 further comprising an insulative layer disposed between the continuous conductive side gate and the 3-dimensional ridge.

3. The FET device of claim 1 further comprising additional layer groups stacked vertically on top of the second layer group, the additional layer groups having interleaved quantum well semiconductive layers and nonconductive layers residing in the 3-dimensional ridge.

4. The FET device of claim 3 further comprising having at least 3 layer groups, the multiple layer groups providing a unity cutoff frequency of the FET device that is at least 50% higher than a unity cutoff frequency of a transistor made of the same semiconducting material as the FET device where the transistor has only a single semiconducting layer.

5. The FET device of claim 1 further comprising at least another ridge similar to the 3-dimensional ridge disposed between the source and drain electrodes and substantially parallel to the 3-dimensional ridge, the at least another ridge having third and fourth edges similar to the first and second edges, respectively, the continuous conductive side gate also engaging the third edges, a top of the at least another ridge, and the fourth edges.

6. The FET device of claim 1 further comprising the FET having operational voltages applied to the drain and continuous conductive side gate electrodes relative to the source electrode, charge density in each of the quantum well semiconductive layers being substantially the same, each quantum well semiconductive layer having a channel width between the first and second edges, each of the nonconductive layers associated with a respective quantum well semiconductive layer in a layer group having a layer thickness, a ratio for each layer group being the respective channel width divided by the respective layer thickness, the ratio for each layer group being less than 8.

7. The FET device of claim 6 wherein the ratio for each layer group is less than 4 and greater than 0.3.

8. The FET device of claim 6 further comprising the 3-dimensional ridge having a pyramid-like cross section with the channel width for quantum well semiconductive layers decreasing with distance from the substrate, the ratio for one layer group being less than the ratio for another layer group that is immediately below the one layer group, the ratio relationship resulting in turn-ON side gate voltage for each quantum well semiconductive layer being substantially the same in order to provide RF amplification linearity for small signals.

9. The FET device of claim 1 further comprising the multiple layer groups causing a linearity based on $3^{rd}$ order intermodulation intercept power that is more than 5 times more than a high electron mobility transistor.

10. The FET device of claim 1 further comprising the multiple layer groups causing less than 5 times as much DC power required for operation as required by a high electron mobility transistor.

11. A radio frequency amplifier implemented by a field effect transistor (FET) comprising:
 a FET structure means for producing a unity cutoff frequency of the FET that is at least 50% higher than a unity cutoff frequency of a transistor made of the same semiconducting material as the FET where the transistor has only a single semiconducting channel, the FET structure means comprising:
  at least first and second vertically stacked layer groups where each layer group has a nonconductive layer and a quantum well semiconductive layer adjacent the nonconductive layer;
  a source electrode in conductive contact with the semiconductive layers;
  a drain electrode spaced apart from the source electrode and in conductive contact with the semiconductive layers;
  a 3-dimensional ridge being a portion of the layer groups is disposed between the source and drain electrodes, the 3-dimensional ridge defined between spaced apart trenches, the 3-dimensional ridge having a top that intersects first and second sides defined by the respective trenches;
  a continuous conductive side gate disposed along the first and second sides and across the top of the 3-dimensional ridge;
  a gate electrode disposed in conductive contact with the continuous conductive side gate.

12. The radio frequency amplifier of claim 11 further comprising at least another ridge similar to the 3-dimensional ridge disposed between the source and drain electrodes and substantially parallel to the 3-dimensional ridge, the at least another ridge having sides and a top, the continuous conductive side gate also engaging the sides and top of the at least another ridge.

13. The radio frequency amplifier of claim 11 further comprising:
 the FET having operational voltages applied to the drain and continuous conductive side gate electrodes relative to the source electrode, charge density in each of the quantum well semiconductive layers being substantially the same, each quantum well semiconductive layer having a channel width between the first and second sides of the 3-dimensional ridge, each of the nonconductive layers associated with a respective quantum well semiconductive layer in a layer group having a layer thickness, a ratio for each layer group being the respective channel width divided by the respective layer thickness, the ratio for each layer group being less than 8;
 the 3-dimensional ridge having a pyramid-like cross section with the channel width for quantum well semiconductive layers decreasing with distance from a substrate, the ratio for one layer group being less than the ratio for another layer group that is immediately below the one layer group, the ratio relationship resulting in turn-ON side gate voltage for each quantum well semiconductive layer being substantially the same in order to provide RF amplification linearity for small signals.

14. A radio frequency amplifier implemented by a field effect transistor (FET) comprising:
 a FET structure means for producing a linearity figure of merit based on $3^{rd}$ order intermodulation intercept power divided by DC power that is more than 5 times more than a high electron mobility transistor having only a single semiconductive channel, the FET structure means comprising:
  at least first and second vertically stacked layer groups where each layer group has a nonconductive layer and a quantum well semiconductive layer adjacent the nonconductive layer;
  a source electrode in conductive contact with the semiconductive layers;
  a drain electrode spaced apart from the source electrode and in conductive contact with the semiconductive layers;
  a 3-dimensional ridge being a portion of the layer groups is disposed between the source and drain electrodes, the 3-dimensional ridge defined between spaced apart trenches, the 3-dimensional ridge having a top that intersects first and second sides defined by the respective trenches;
  a continuous conductive side gate disposed along the first and second sides and across the top of the 3-dimensional ridge;
  a gate electrode disposed in conductive contact with the continuous conductive side gate.

15. The radio frequency amplifier of claim 14 further comprising at least another ridge similar to the 3-dimensional ridge disposed between the source and drain electrodes and substantially parallel to the 3-dimensional ridge, the at least another ridge having sides and a top, the continuous conductive side gate also engaging the sides and top of the at least another ridge.

16. The radio frequency amplifier of claim 14 further comprising:
 the FET having operational voltages applied to the drain and continuous conductive side gate electrodes relative to the source electrode, charge density in each of the quantum well semiconductive layers being substantially the same, each quantum well semiconductive layer having a channel width between the first and second sides of the 3-dimensional ridge, each of the nonconductive layers associated with a respective quantum well semiconductive layer in a layer group having a layer thickness, a ratio for each layer group being the respective channel width divided by the respective layer thickness, the ratio for each layer group being less than 8;

the 3-dimensional ridge having a pyramid-like cross section with the channel width for quantum well semiconductive layers decreasing with distance from a substrate, the ratio for one layer group being less than the ratio for another layer group that is immediately below the one layer group, the ratio relationship resulting in turn-ON side gate voltage for each quantum well semiconductive layer being substantially the same in order to provide RF amplification linearity for small signals.

17. A radio frequency amplifier implemented by a field effect transistor (FET) comprising:

a FET structure means for using less than 5 times as much DC power for operation as required for operation by a high electron mobility transistor having only a single semiconductive channel, the FET structure means comprising:

at least first and second vertically stacked layer groups where each layer group has a nonconductive layer and a quantum well semiconductive layer adjacent the nonconductive layer;

a source electrode in conductive contact with the semiconductive layers;

a drain electrode spaced apart from the source electrode and in conductive contact with the semiconductive layers;

a 3-dimensional ridge being a portion of the layer groups is disposed between the source and drain electrodes, the 3-dimensional ridge defined between spaced apart trenches, the 3-dimensional ridge having a top that intersects first and second sides defined by the respective trenches;

a continuous conductive side gate disposed along the first and second sides and across the top of the 3-dimensional ridge;

a gate electrode disposed in conductive contact with the continuous conductive side gate.

18. The radio frequency amplifier of claim 17 further comprising at least another ridge similar to the 3-dimensional ridge disposed between the source and drain electrodes and substantially parallel to the 3-dimensional ridge, the at least another ridge having sides and a top, the continuous conductive side gate also engaging the sides and top of the at least another ridge.

19. The radio frequency amplifier of claim 17 further comprising:

the FET having operational voltages applied to the drain and continuous conductive side gate electrodes relative to the source electrode, charge density in each of the quantum well semiconductive layers being substantially the same, each quantum well semiconductive layer having a channel width between the first and second sides of the 3-dimensional ridge, each of the nonconductive layers associated with a respective quantum well semiconductive layer in a layer group having a layer thickness, a ratio for each layer group being the respective channel width divided by the respective layer thickness, the ratio for each layer group being less than 8;

the 3-dimensional ridge having a pyramid-like cross section with the channel width for quantum well semiconductive layers decreasing with distance from a substrate, the ratio for one layer group being less than the ratio for another layer group that is immediately below the one layer group, the ratio relationship resulting in turn-ON side gate voltage for each quantum well semiconductive layer being substantially the same in order to provide RF amplification linearity for small signals.

* * * * *